(12) United States Patent
Hong et al.

(10) Patent No.: US 8,932,925 B1
(45) Date of Patent: Jan. 13, 2015

(54) SPLIT-GATE NON-VOLATILE MEMORY (NVM) CELL AND DEVICE STRUCTURE INTEGRATION

(71) Applicants: Cheong Min Hong, Austin, TX (US); Karthik Ramanan, Austin, TX (US)

(72) Inventors: Cheong Min Hong, Austin, TX (US); Karthik Ramanan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/973,549

(22) Filed: Aug. 22, 2013

(51) Int. Cl.
| | |
|---|---|
| H01L 29/792 | (2006.01) |
| H01L 27/06 | (2006.01) |
| H01L 29/78 | (2006.01) |
| H01L 29/66 | (2006.01) |
| H01L 21/02 | (2006.01) |

(52) U.S. Cl.
CPC ...... H01L 29/7831 (2013.01); H01L 29/66484 (2013.01); H01L 21/02601 (2013.01); H01L 27/0629 (2013.01); H01L 29/66181 (2013.01); H01L 29/66833 (2013.01); H01L 29/792 (2013.01)
USPC .......................................... 438/261; 438/267

(58) Field of Classification Search
USPC ....................................................... 438/267
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |

(Continued)

FOREIGN PATENT DOCUMENTS

WO 2009058486 5/2009

OTHER PUBLICATIONS

Office Action mailed Nov. 22, 2013 in U.S. Appl. No. 13/780,591.

(Continued)

*Primary Examiner* — Stephen W Smoot
(74) *Attorney, Agent, or Firm* — James L. Clingan, Jr.; Joanna G. Chiu

(57) ABSTRACT

A method includes forming a first conductive layer over a substrate in a first region and second region of the substrate; patterning the first conductive layer to form a select gate in the first region and to remove the first conductive layer from the second region; forming a charge storage layer over the select gate and the substrate in the first region and over the substrate in the second region; forming a second conductive layer over the charge storage layer in the first and second regions; and patterning the second conductive layer and charge storage layer to form a control gate overlapping the select gate in the first region, wherein a first portion of the charge storage layer remains between the select gate and control gate, and to form an electrode in the second region, wherein a second portion of the charge storage layer remains between the electrode and substrate.

16 Claims, 5 Drawing Sheets

(56) References Cited

U.S. PATENT DOCUMENTS

| | | | |
|---|---|---|---|
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,745,344 B2 * | 6/2010 | Chindalore ............... 438/738 |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Hall et al. |
| 8,679,927 B2 | 3/2014 | Ramkumar et al. |
| 8,871,598 B1 * | 10/2014 | Perera ............... 438/299 |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | SHEN et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |

OTHER PUBLICATIONS

Office Action mailed Jan. 31, 2014 in U.S. Appl. No. 13/781,727.
Office Action—Allowance mailed Feb. 21, 2014 in U.S. Appl. No. 13/441,426.
Office Action—Allowance mailed Feb. 28, 2014 in U.S. Appl. No. 13/442,142.
Office Action—Allowance mailed Mar. 3, 2014 in U.S. Appl. No. 13/790,014.
Office Action—Allowance mailed Mar. 6, 2014 in U.S. Appl. No. 13/491,771.
Office Action—Allowance mailed Mar. 11, 2014 in U.S. Appl. No. 13/907,491.
Office Action—Allowance mailed Mar. 12, 2014 for U.S. Appl. No. 13/790,225.
Krishnan, S., et al., "A Manufacturable Dual Channel (Si and SiGe) High-K Metal Gate CMOS Technology with Multiple Oxides for High Performance and Low Power Applications", IEEE , IEDM 2011, IEDM11-637, pp. 28.1.1-28.1.4.
U.S. Appl. No. 13/781,727, Office Action—Allowance, May 12, 2014.
U.S. Appl. No. 13/441,426, Shroff, M. D., et al., Office Action—Allowance, mailed Jun. 9, 2014.
U.S. Appl. No. 13/907,491, Office Action—Rejection, Sep. 3, 2013.
U.S. Appl. No. 13/343,331, Office Action—Allowance, Nov. 8, 2013.
Office Action mailed Dec. 24, 2013 in U.S. Appl. No. 13/790,225.
Office Action mailed Dec. 24, 2013 in U.S. Appl. No. 13/790,014.
Office Action mailed Dec. 24, 2013 in U.S. Appl. No. 13/780,574.
Office Action mailed Dec. 31, 2013 in U.S. Appl. No. 13/442,142.
Office Action mailed Jan. 16, 2014 in U.S. Appl. No. 13/491,771.
Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect,

(56) References Cited

OTHER PUBLICATIONS com, Solid-State Electronics, vol. 61, Issue 1, Jul. 2011, pp. 100-105, http://wwww.sciencedirect.com/science/article/pii/S0038110111000803.

Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao: P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.

U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—Ex Parte Quayle, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M.., et al., "Non-Volatile Memory and Logic Circuit Process Integration", Office Action—Rejection, Feb. 6, 2013.

U.S. Appl. No. 13/077,491, Shroff, M.., et al., "Non-Volatile Memory and Logic Circuit Process Integration", Office Action—Allowance, Jun. 18, 2013.

U.S. Appl. No. 13/077,501, Shroff, M.., et al., "Non-Volatile Memory and Logic Circuit Process Integration", Office Action—Allowance, Nov. 26, 2012.

U.S. Appl. No. 13/313,179, Shroff, M., et al., "Method of Protecting Against Via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (NVM) and Logic Integration", Office Action—Allowance, Sep. 9, 2013.

U.S. Appl. No. 13/780,574, Hall, M.D., et al., Non-Volatile Memory (NVM) and Logic Integration, Office Action—Allowance, Sep. 6, 2013.

U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.

U.S. Appl. No. 13/491,771, Hall, M., et al., "Integrating Formation of a Replacement Gate Transistor and a Non-Volatile Memory Cell Using a High-K Dielectric", filed Jun. 8, 2012.

U.S. Appl. No. 13/790,225, Hall, M., et al., "Integrating Formation of a Replacement Gate Transistor and a non-Volatile Memory Cell Having Thin Film Storage", filed Mar. 8, 2013.

U.S. Appl. No. 13/790,014, Hall, M., et al., "Integrating Formation of a Logic Transistor and a None-Volatile Memory Cell Using a Partial Replacement Gate Technique", filed Mar. 8, 2013.

U.S. Appl. No. 13/955,665, Perera, A.H., "Non-Volatile Memory (NVM) and High K and Metal Gate Integration Using Gate First Methodology", filed Jul. 31, 2013.

U.S. Appl. No. 13/971,987, Perera, A.H., et al., "Integrated Split Gate Non-Volatile Memory Cell and Logic Structure", filed Aug. 21, 2013.

U.S. Appl. No. 13/972,372, Perera, A.H., et al., "Integrated Split Gate Non-Volatile Memory Cell and Logic Device", filed Aug. 21, 2013.

U.S. Appl. No. 13/962,338, Perera, A.H., "Nonvolatile Memory Bitcell With Inlaid High K Metal Select Gate", filed Aug. 8, 2013.

U.S. Appl. No. 13/928,666, Hong, C. M., et al., "Non-Volatile Memory (NVM) and High Voltage Transistor Integration", filed Jun. 27, 2013.

U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.

U.S. Appl. No. 13/780,591, Hall, M.D., et al., "Non-Volatile Memory (NVM) and Logic Integration", filed Feb. 28, 2013.

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.

U.S. Appl. No. 13/661,157, Shroff, M.D., et al., "Method of Making a Logic Transistor and a Non-Volatile Memory (NVM) Cell", file Oct. 26, 2012.

U.S. Appl. No. 13/781,727, Shroff, M., et al., "Methods of Making Logic Transistors and non-Volatile Memory Cells", Office Action—Restriction, Jun. 21, 2013.

U.S. Appl. No. 13/928,666, Hong, Office Action—Rejection, mailed Jul. 23, 2014.

U.S. Appl. No. 14/041,662, Perera, Office Action—Restriction, mailed Aug. 1, 2014.

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/661,157, Office Action—Restriction, mailed Oct. 2, 2014.

U.S. Appl. No. 13/441,426, Shroff, Office Action—Allowance, mailed Sep. 26, 2014.

U.S. Appl. No. 14/041,662, Perera, Office Action—Allowance, mailed Oct. 17, 2014.

U.S. Appl. No. 13/780,591, Office Action—Allowance, mailed Nov. 13, 2014.

* cited by examiner

US 8,932,925 B1

SPLIT-GATE NON-VOLATILE MEMORY (NVM) CELL AND DEVICE STRUCTURE INTEGRATION

BACKGROUND

1. Field

This disclosure relates generally to non-volatile memories (NVMs) and device structures, and more particularly, to integrating split-gate NVM cells with device structures.

2. Related Art

The integration of non-volatile memories (NVMs) with any other device structrure has always been a challenge due to the different requirements for the NVM transistors, which store charge, and other device structures which are commonly intended for some other functions such as a capacitor. The need for storing charge has been addressed mostly with the use of floating gates but also with nanocrystals or nitride. In any of these cases, the need for this unique layer makes integration of the NVM transistors and the logic transistors difficult, particularly when using a split-gate structure for the NVM. The particular type of charge storage layer can also have a large effect on the options that are available in achieving the integration.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a split-gate non-volatile-memory (NVM) cell and a device structure includes using the conductive layer that forms control gate of the NVM cell also is used to form an electrode of the device structure. Source/drain implants for the NVM cell can also be used for the device structure. The resulting source/drain implants in the device structure can be used to enhance capacitive characteristics of device structure. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
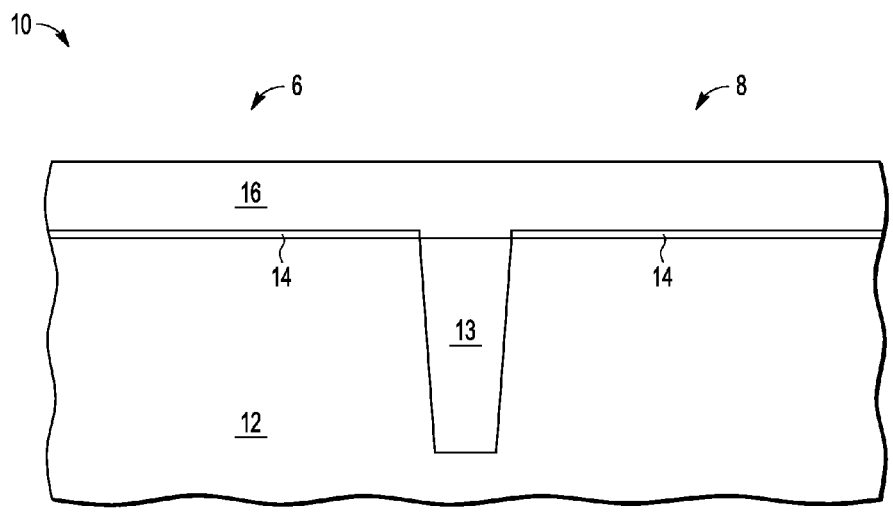
FIG. 1 is a cross section of a semiconductor structure having a split-gate non-volatile-memory (NVM) structure and a device structure at a stage in processing according to an embodiment.

Shown in FIG. 1 is a semiconductor structure 10 of an integrated circuit having an a first region 6 for use in forming a split-gate NVM cell and a second region 8 for use in forming a device structure which may be a capacitor. The device structure in second region 8 could also be a transistor particularly suited for high voltage or even as an alternative NVM type of cell. Semiconductor structure 10 has a substrate 12, an isolation region 13 separating first region 6 from second region 8, an oxide layer 14 on the top surface of substrate 12 in first region 6 and second region 8. Oxide layer 14 is a thermal oxide that is grown, rather than deposited, for high quality. Over oxide layer 14 and isolation region 13 is a polysilicon layer 16 that may be doped in situ or by implant. Substrate 12 may be P type. By way of example, oxide layer 14 may be 20 to 60 Angstroms thick and polysilicon layer 16 may be 400 to 600 Angstroms thick.

Figure 2:
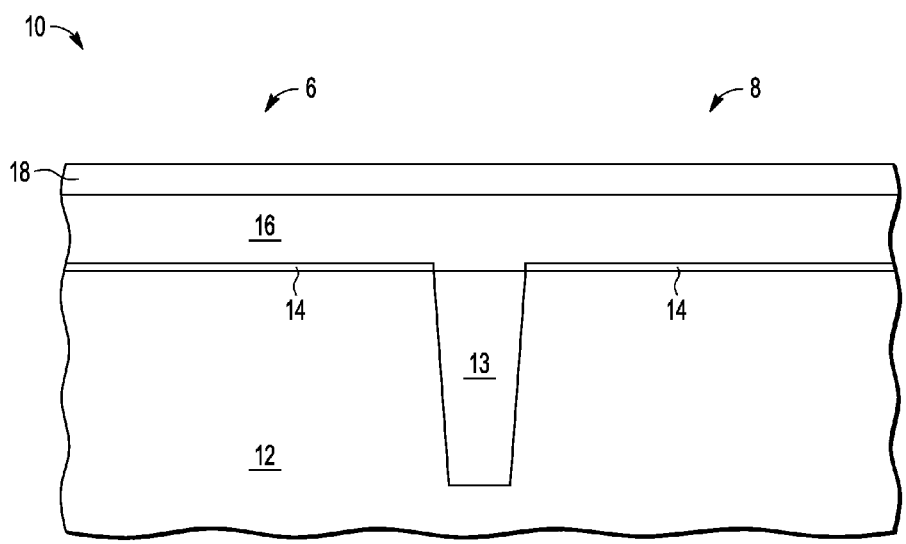
FIG. 2 is a cross section of the semiconductor structure of FIG. 1 at a subsequent stage in processing.

Shown in FIG. 2 is semiconductor structure 10 after depositing a dielectric layer 18 that may be about 200 Angstroms thick. Dielectric layer 18 may be a stack of dielectric layers such as a layer of deposited oxide on polysilicon layer 16 and a nitride layer on the oxide layer. In such case the nitride layer is preferably thicker than the oxide layer.

Figure 3:
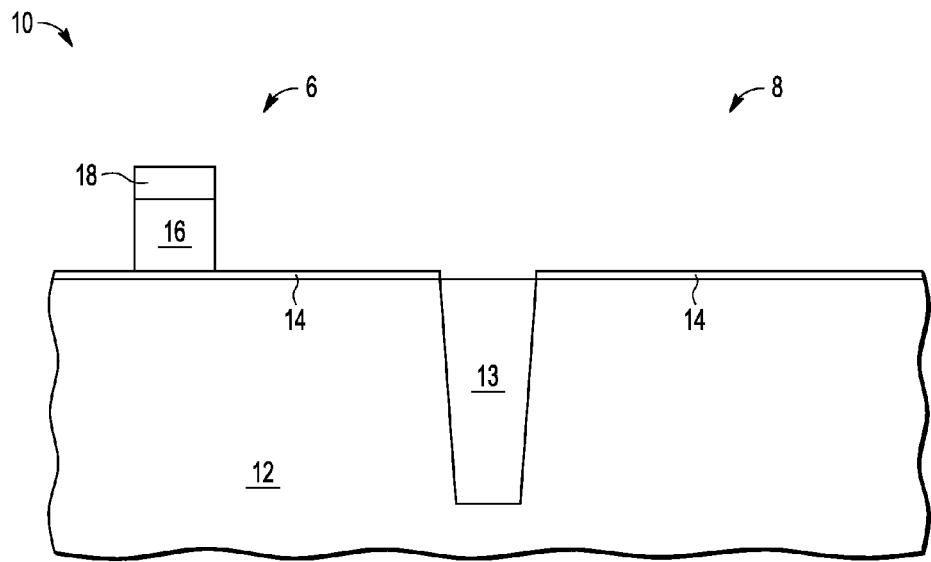
FIG. 3 is a cross section of the semiconductor structure of FIG. 2 at a subsequent stage in processing.

Shown in FIG. 3 is semiconductor structure 10 after patterning polysilicon layer 16 and dielectric layer 18 to leave a portion of polysilicon layer 16 and dielectric layer 18 in first region 6 and remove polysilicon layer 16 and dielectric layer 18 from second region 8. The portion of polysilicon layer 16 remaining in first region 6 is for use as a select gate of an NVM cell to be formed in first region 6.

Figure 4:
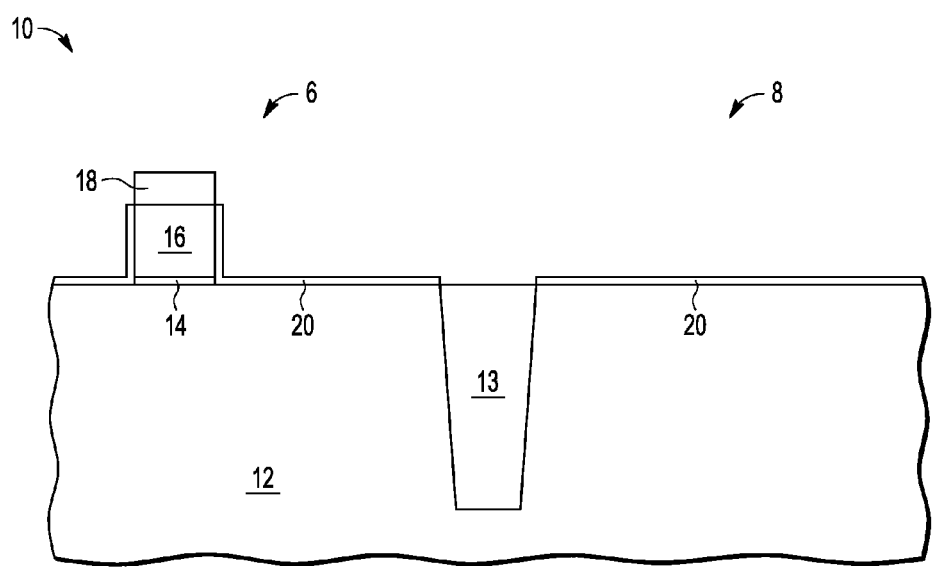
FIG. 4 is a cross section of the semiconductor structure of FIG. 3 at a subsequent stage in processing.

Shown in FIG. 4 is semiconductor structure 10 after removing oxide layer 14 from region 6 not covered by the remaining portion of polysilicon layer 16, which may be referenced as select gate 16, and from second region 8 and growing an oxide layer 20. Oxide layer 20 is on substrate 12 in first region 6 except where covered by select gate 16, along the polysilicon sidewalls of select gate 16, and on substrate 12 in second region 8. Oxide layer 20 may be 30-100 Angstroms thick.

Figure 5:
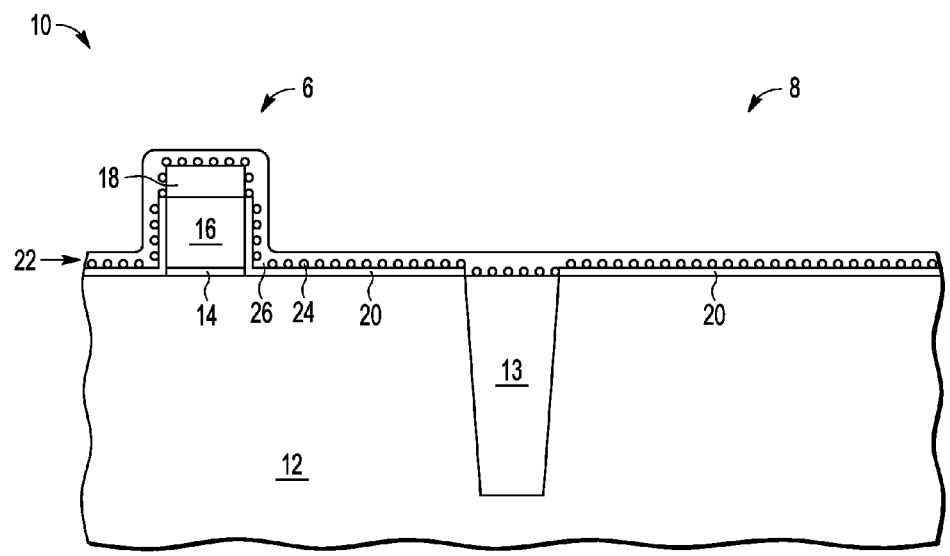
FIG. 5 is a cross section of the semiconductor structure of FIG. 4 at a subsequent stage in processing.

Shown in FIG. 5 is semiconductor structure 10 after forming a plurality of nanocrystals 22, of which nanocrystal 24 is an example, on oxide layer 20, on isolation region 13, and on dielectric layer 18 on select gate 16 and depositing an oxide layer 26 on and around plurality of nanocrystals 22. Oxide layer 20, plurality of nanocrystals 22, and oxide layer 26 together result in a charge storage layer that has been formed over an exposed portion of substrate 12 and over select gate 16 in first region 6 and on substrate 12 in second region 8. Oxide layer 20, plurality of nanocrystals 22, and oxide layer 26 may be collectively referenced as charge storage layer 20, 22, 26.

Figure 6:
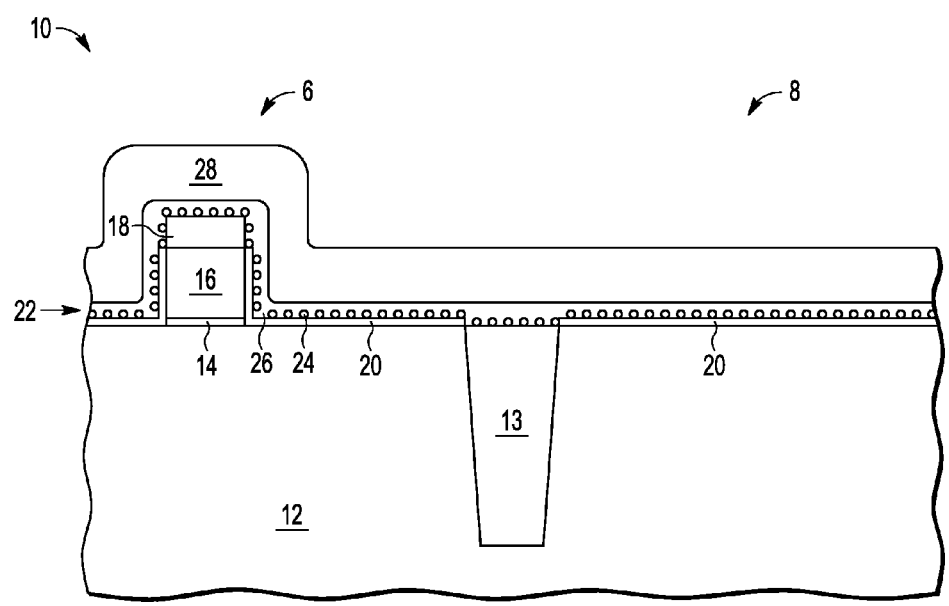
FIG. 6 is a cross section of the semiconductor structure of FIG. 5 at a subsequent stage in processing.

Shown in FIG. 6 is semiconductor structure 10 after forming a conductive layer 28 on charge storage layer 20, 22, 26. Conductive layer 28 may be a layer of polysilicon that has been doped in situ or by implant and may be 400 to 600 Anstroms in thickness.

Figure 7:
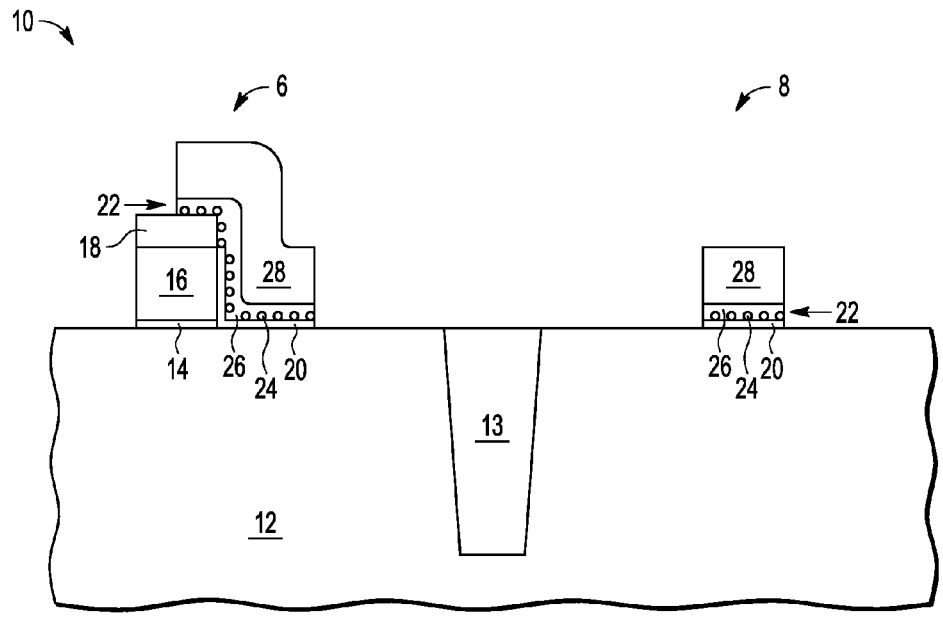
FIG. 7 is a cross section of the semiconductor structure of FIG. 6 at a subsequent stage in processing.

Shown in FIG. 7 is semiconductor structure 10 after etching conductive layer 28 and charge storage layer 20, 22, 26 to leave a portion of conductive layer 28 and charge storage layer 20, 22, 26 over (i) a portion of select gate 16, along a first sidewall of select gate 16 and dielectric layer 18, and a portion of substrate 12 adjacent to the first sidewall in region 6 and (ii) a portion of substrate 12 in second region 8. The remaining portion of conductive layer 28 in region 6 is for use as a control gate and may be referenced as control gate 28. The remaining portion of charge storage layer 20, 22, 26 adjacent to the first sidewall is between select gate 16 and control gate 28. The remaining portion of conductive layer 28 in second region 8 may be used an electrode of a device structure and may be referenced as electrode 28.

Figure 8:
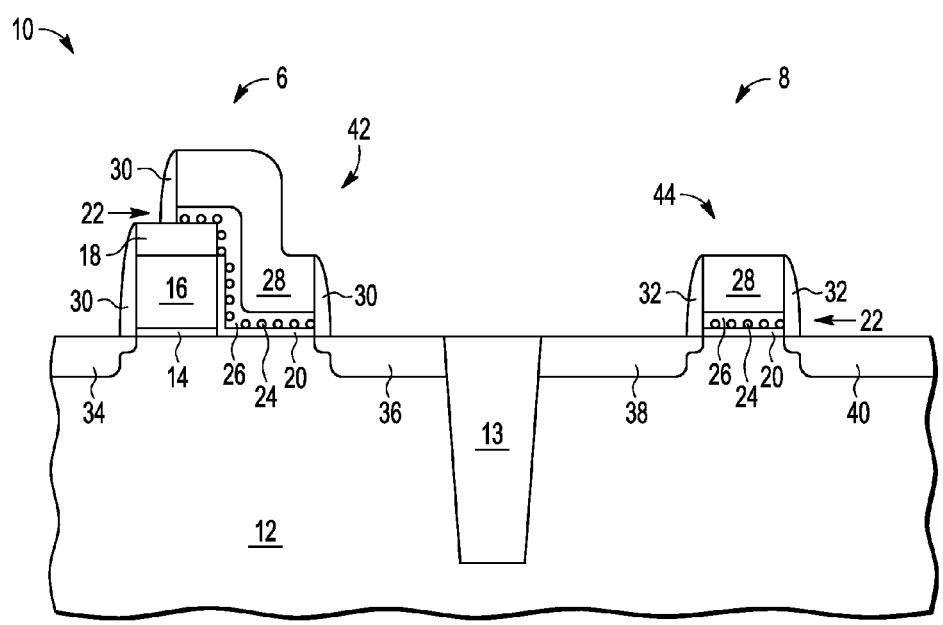
FIG. 8 is a cross section of the semiconductor structure of FIG. 7 at a subsequent stage in processing.

Shown in FIG. 8 is semiconductor structure 10 after forming sidewall spacers 30 on exposed sides of select gate 16 and control gate 28 and source/drain regions 34 and 36 in substrate 12 in first region 6 to result in a split-gate NVM cell 42 in first region 6 and forming sidewall spacers 32 on the sides of electrode 28 and source/drain regions 38 and 40 in second region 8 to result in a device structure 44 that may be used as a capacitor, an NVM cell, or a high voltage transistor.

Figure 9:
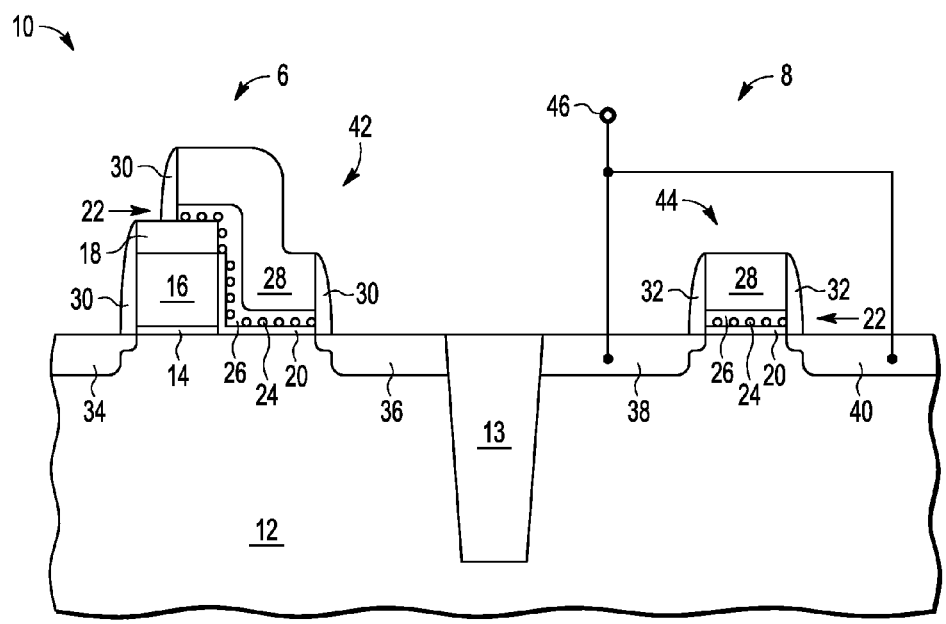
FIG. 9 is a cross section of the semiconductor structure of FIG. 8 and a circuit connection for particular use of the device structure as a capacitor.

Shown in FIG. 9 is semiconductor structure 10 showing source/drain regions 38 and 40 connected together at a node 46 for the case of device structure 44 being used as a capacitor. In such case, node 46 would be one electrode of the capacitor and electrode 28 would be the other electrode of the capacitor. Electrode 46 would also be tied to substrate 12 in region 8. In the shown configuration, electrode 46 would be tied to the same voltage as substrate 12 in region 6, which would likely be ground. There are many uses for capacitors in which one terminal is tied to ground. On the other hand, different wells that isolated from each other could be used in regions 6 and 8 and thus enable electrode 46 to be at a different potential from the well in region 6.

The use of the charge storage layer which uses nanocrystals as the dielectric layer of a capacitor results in a high voltage capacitor. NVM cells such as NVM cell 42 require high voltage for program and erase. By using common elements in forming the capacitor as in forming the NVM cell, the high voltage capability of the capacitor will correspond to the high voltage program and erase needs of the NVM cell. That is to say, that the ability to generate a high voltage with the capacitor formed from device structure 44 will scale with the high voltage requirements of NVM cell 42.

By now it should be appreciated that there has been provided a method for forming a semiconductor structure. The method includes forming a first conductive layer over a substrate in a first region and a second region of the substrate. The method further includes patterning the first conductive layer to form a select gate in the first region and to remove the first conductive layer from the second region. The method further includes forming a charge storage layer over the select gate and the substrate in the first region and over the substrate in the second region. The method further includes forming a second conductive layer over the charge storage layer in the first region and the second region. The method further includes patterning the second conductive layer and the charge storage layer to form a control gate overlapping the select gate in the first region, wherein a first portion of the charge storage layer remains between the select gate and the control gate, and to form an electrode in the second region, wherein a second portion of the charge storage layer remains between the electrode and the substrate. The method may have a further characterization by which the electrode is further characterized as an electrode of a capacitor. The method may have a further characterization by which the electrode is further characterized as a gate of a transistor. The method may have a further characterization by which the electrode is further characterized as a gate of a memory cell. The method may further include forming a first source drain region in the substrate adjacent a sidewall of the select gate and forming a second source/drain region in the substrate adjacent a first sidewall of the control gate. The method may further include. The method may further include forming a sidewall spacer over the substrate and adjacent the sidewall of the select gate, over the substrate and adjacent the first sidewall of the control gate, and over the select gate and adjacent a second sidewall of the control gate. The method may further include forming a third source/drain region in the substrate adjacent a first sidewall of the electrode and forming a fourth source/drain region in the substrate adjacent a second sidewall of the electrode. The method may further include forming a sidewall spacer adjacent the first and second sidewalls of the electrode. The method may have a further characterization by which the control gate, the first portion of the charge storage layer, and the select gate are further characterized as a portion of a memory device. The method may have a further characterization by which the forming the charge storage layer includes forming a plurality of nanocrystals over the select gate and the substrate in the first region and over the substrate in the second region and forming a dielectric layer over the plurality of nanocrystals. The method may further include, prior to forming the first conductive layer over the substrate, forming a first well in the substrate in the first region and forming a second well in the substrate in the second region, wherein the select gate and the control gate over formed over the first well, and the electrode is formed over the second well.

Also described is a method for forming a semiconductor structure. The method includes forming a first conductive layer over a substrate in a first region and a second region of the substrate. The method further includes forming a first conductive layer over a substrate in a first region and a second region of the substrate. The method further includes forming a select gate from the first conductive layer in the first region. The method further includes removing the first conductive layer from the second region. The method further includes forming a charge storage layer over the select gate and the substrate in the first region and over the substrate in the second region. The method further includes forming a second conductive layer over the charge storage layer in the first region and the second region. The method further includes patterning the second conductive layer and the charge storage layer to form a control gate from the second conductive layer overlapping the select gate in the first region, wherein a first portion of the charge storage layer remains between the select gate and the control gate, and to form a capacitor electrode from the second conductive layer in the second region, wherein a second portion of the charge storage layer remains between the capacitor electrode and the second portion of the charge storage layer is further characterized as a capacitor dielectric. The method further includes forming a first source drain region in the substrate adjacent a sidewall of the select gate and a second source/drain region in the substrate adjacent a first sidewall of the control gate. The method may further include forming a third source/drain region in the substrate adjacent a first sidewall of the capacitor electrode and forming a fourth source/drain region in the substrate adjacent a second sidewall of the capacitor electrode. The method may further include forming a sidewall spacer over the substrate and adjacent the sidewall of the select gate, over the substrate and adjacent the first sidewall of the control gate, and over the select gate and adjacent a second sidewall of the control gate. The method may further include forming a sidewall spacer adjacent the first and second sidewalls of the capacitor electrode. The method may have a further characterization by which the forming the charge storage layer includes forming a plurality of nanocrystals over the select gate and the substrate in the first region and over the substrate in the second region and forming a dielectric layer over the plurality of nanocrystals.

Described also is a semiconductor structure having a a substrate having a first region and a second region. The semiconductor structure includes a select gate over the substrate in the first region. The semiconductor structure further includes a control gate overlapping a sidewall of the select gate in the first region. The semiconductor structure further includes a first charge storage layer comprising nanocrystals between the select gate and the control gate. The semiconductor structure further includes an electrode over the substrate in the second region. The semiconductor structure further includes a second charge storage layer comprising nanocrystals between the electrode and the substrate. The semiconductor structure may have a further characterization by which the control gate and the electrode comprise a same set of materials. The semiconductor structure may have a further characterization by which the electrode is further characterized as an electrode of a capacitor. The semiconductor structure may further include a first source drain region in the substrate adjacent a sidewall of the select gate, a second source/drain region in the substrate adjacent a first sidewall of the control gate, and a sidewall space over the substrate and adjacent the sidewall of the select gate, over the substrate and adjacent the first sidewall of the control gate, and over the select gate and adjacent a second sidewall of the control gate.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure, the method comprising:
    forming a first conductive layer over a substrate in a first region and a second region of the substrate;
    patterning the first conductive layer to form a select gate in the first region and to remove the first conductive layer from the second region;
    forming a charge storage layer over the select gate and the substrate in the first region and over the substrate in the second region;
    forming a second conductive layer over the charge storage layer in the first region and the second region; and
    patterning the second conductive layer and the charge storage layer to form a control gate overlapping the select gate in the first region, wherein a first portion of the charge storage layer remains between the select gate and the control gate, and to form an electrode in the second region, wherein a second portion of the charge storage layer remains between the electrode and the substrate.

2. The method of claim 1, wherein the electrode is further characterized as an electrode of a capacitor.

3. The method of claim 1, wherein the electrode is further characterized as a gate of a transistor.

4. The method of claim 1, wherein the electrode is further characterized as a gate of a memory cell.

5. The method of claim 1, further comprising:
    forming a first source drain region in the substrate adjacent a sidewall of the select gate; and
    forming a second source/drain region in the substrate adjacent a first sidewall of the control gate.

6. The method of claim 5, further comprising:
    forming a sidewall spacer over the substrate and adjacent the sidewall of the select gate, over the substrate and adjacent the first sidewall of the control gate, and over the select gate and adjacent a second sidewall of the control gate.

7. The method of claim 5, further comprising:
    forming a third source/drain region in the substrate adjacent a first sidewall of the electrode; and
    forming a fourth source/drain region in the substrate adjacent a second sidewall of the electrode.

8. The method of claim 7, further comprising:
    forming a sidewall spacer adjacent the first and second sidewalls of the electrode.

9. The method of claim 1, wherein the control gate, the first portion of the charge storage layer, and the select gate are further characterized as a portion of a memory device.

10. The method of claim 1, wherein the forming the charge storage layer comprises:
    forming a plurality of nanocrystals over the select gate and the substrate in the first region and over the substrate in the second region; and
    forming a dielectric layer over the plurality of nanocrystals.

11. The method of claim 1, further comprising:
    prior to forming the first conductive layer over the substrate, forming a first well in the substrate in the first region and forming a second well in the substrate in the second region, wherein the select gate and the control gate over formed over the first well, and the electrode is formed over the second well.

12. A method for forming a semiconductor structure, the method comprising:
    forming a first conductive layer over a substrate in a first region and a second region of the substrate;
    forming a select gate from the first conductive layer in the first region;
    removing the first conductive layer from the second region;
    forming a charge storage layer over the select gate and the substrate in the first region and over the substrate in the second region;
    forming a second conductive layer over the charge storage layer in the first region and the second region;
    patterning the second conductive layer and the charge storage layer to form a control gate from the second conductive layer overlapping the select gate in the first region, wherein a first portion of the charge storage layer remains between the select gate and the control gate, and to form a capacitor electrode from the second conductive layer in the second region, wherein a second portion of the charge storage layer remains between the capacitor electrode and the substrate and the second portion of the charge storage layer is further characterized as a capacitor dielectric; and forming a first source drain region in the substrate adjacent a sidewall of the select gate and a second source/drain region in the substrate adjacent a first sidewall of the control gate.

13. The method of claim 12, further comprising:
forming a third source/drain region in the substrate adjacent a first sidewall of the capacitor electrode; and
forming a fourth source/drain region in the substrate adjacent a second sidewall of the capacitor electrode.

14. The method of claim 13, further comprising:
forming a sidewall spacer adjacent the first and second sidewalls of the capacitor electrode.

15. The method of claim 12, further comprising:
forming a sidewall spacer over the substrate and adjacent the sidewall of the select gate, over the substrate and adjacent the first sidewall of the control gate, and over the select gate and adjacent a second sidewall of the control gate.

16. The method of claim 12, wherein the forming the charge storage layer comprises:
forming a plurality of nanocrystals over the select gate and the substrate in the first region and over the substrate in the second region; and
forming a dielectric layer over the plurality of nanocrystals.

\* \* \* \* \*